United States Patent
Pan et al.

(10) Patent No.: US 7,723,853 B2
(45) Date of Patent: May 25, 2010

(54) CHIP PACKAGE WITHOUT CORE AND STACKED CHIP PACKAGE STRUCTURE

(75) Inventors: Yu-Tang Pan, Tainan County (TW); Cheng-Ting Wu, Tainan County (TW); Shih-Wen Chou, Tainan County (TW); Hui-Ping Liu, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/196,791

(22) Filed: Aug. 22, 2008

(65) Prior Publication Data

US 2008/0303174 A1 Dec. 11, 2008

Related U.S. Application Data

(62) Division of application No. 11/302,736, filed on Dec. 13, 2005, now Pat. No. 7,436,074.

(30) Foreign Application Priority Data

Jul. 14, 2005 (TW) .............................. 94123850 A

(51) Int. Cl.
H01L 23/48 (2006.01)
H01L 23/52 (2006.01)
H01L 29/40 (2006.01)

(52) U.S. Cl. .................. 257/778; 257/779; 257/787; 257/E23.02; 257/E23.021

(58) Field of Classification Search ................. 257/778, 257/779, 780, 781, 784, 787, E23.02, E23.021
See application file for complete search history.

(56) References Cited

U.S. PATENT DOCUMENTS

| 5,668,405 | A | * | 9/1997 | Yamashita | 257/668 |
| 6,528,722 | B2 | * | 3/2003 | Huang et al. | 174/528 |
| 6,858,919 | B2 | * | 2/2005 | Seo et al. | 257/666 |
| 7,436,074 | B2 | * | 10/2008 | Pan et al. | 257/783 |

* cited by examiner

*Primary Examiner*—Hoai v Pham
(74) *Attorney, Agent, or Firm*—J.C. Patents

(57) ABSTRACT

A chip package including a base, a chip, a molding compound and a plurality of outer terminals is provided. The base is essentially consisted of a patterned circuit layer having a first surface and a second surface opposite to each other and a solder mask disposed on the second surface, wherein the solder mask has a plurality of first openings by which part of the patterned circuit layer is exposed. The chip is disposed on the first surface and is electrically connected to the patterned circuit layer. The molding compound covers the pattern circuit layer and fixes the chip onto the patterned circuit layer. The outer terminals are disposed in the first openings and electrically connected to the patterned circuit layer.

5 Claims, 5 Drawing Sheets

CHIP PACKAGE WITHOUT CORE AND STACKED CHIP PACKAGE STRUCTURE

CROSS-REFERENCE TO RELATED APPLICATION

This application is a division of application Ser. No. 11/302,736, filed on Dec. 13, 2005, which claims the priority benefit of Taiwan application serial no. 94123850, filed on Jul. 14, 2005. All disclosure of the cross-references is incorporated herein by reference.

BACKGROUND OF THE INVENTION

1. Field of Invention

The present invention relates to a chip package without a core and stacked package structure thereof. More particularly, the present invention relates to a chip package having small thickness and without a core, and stacked package structure thereof.

2. Description of Related Art

In the information era today, users prefer electronic products with high speed, high quality and versatile functions. In terms of product appearance, the design of the electronic products tends to be lighter, thinner, shorter and smaller. In order to achieve the above aspects, many companies have incorporated a systematic concept in the circuit design. Accordingly, the single chip can have versatile functions to reduce the number of the chips disposed in the electronic products. Moreover, in the technology of electronic package, in order to meet the light, thin, short and small design trend, the package design concept of the of multi-chip module (MCM), chip scale package (CSP) and stacked multi-chip have been developed. The following is a description of several conventional chip package structures.

FIG. 1 is a cross-sectional diagram of a conventional stacked chip package structure. Referring to FIG. 1, the conventional stacked chip package structure 50 includes a package substrate 100 and multiple chip packages 200a, 200b, wherein the chip packages 200a, 200b stacked on the circuit substrate 100 are electrically connected to the circuit substrate 100. Each of the chip packages 200a, 200b includes a package substrate 210, a chip 220, multiple bumps 230, an under fill 240 and multiple solder balls 250. The chip 220 and the bumps 230 are disposed on the package substrate 210, the bumps 230 are disposed between the chip 220 and the package substrate 210, and the chip 220 is electrically connected to the package substrate 210 via the bumps 230. The under fill 240 disposed between the chip 220 and the package substrate 210 cover these bumps 230.

The package substrate 210 has multiple conductive poles 212 and multiple bonding pads 214, wherein each conductive pole 212 passes through the package substrate 210, and each bonding pad 214 is disposed on the conductive pole 212. Moreover, each solder ball 250 is disposed on the bonding pad 214. Accordingly, the chip package 200a is electrically connected to the chip package 200b by the solder ball 250, and the chip package 200b is electrically connected to the circuit substrate 100 by the solder ball 250.

In general, in the manufacturing method of the package substrate 210, the core dielectric layer is used as the core material, the patterned circuit layer and the patterned dielectric layer are inter-stacked on the core dielectric layer in a fully additive process, semi-additive process, subtractive process or other process. Accordingly, the core dielectric layer may take a major proportion in the entire thickness of the package substrate 210. Therefore, if the thickness of the core dielectric layer can not be reduced effectively, it would be a big obstacle in reducing the thicknesses of the chip package 200a and 200b.

Of course, when a bottleneck is met in the reduction of the thicknesses of the chip package 200a and 200b, the entire thickness of the stacked chip package structure 50 cannot be effectively reduced, such that the package integrity of the stacked chip package structure 50 cannot be improved effectively.

SUMMARY OF THE INVENTION

Accordingly, the present invention is directed to provide a chip package and a stacked chip package structure with thinner thickness and high package integrity.

As embodied and broadly described herein, the present invention is directed to provide a chip package including a base, a chip, a molding compound and a plurality of outer terminals. The base is essentially consisted of a patterned circuit layer having a first surface and a second surface opposite to each other and a solder mask disposed on the second surface, wherein the solder mask has a plurality of first openings by which part of the patterned circuit layer is exposed. The chip is disposed on the first surface and is electrically connected to the patterned circuit layer. The molding compound covers the pattern circuit layer and fixes the chip onto the patterned circuit layer. The outer terminals are disposed in the first openings and electrically connected to the patterned circuit layer.

In an embodiment of the present invention, the outer terminals include solder balls.

In an embodiment of the present invention, the chip package further comprises a plurality of bumps disposed between the chip and the patterned circuit layer, wherein the chip is electrically connected to the patterned circuit layer through the bumps.

In an embodiment of the present invention, the chip package further comprises an under fill disposed between the chip and the patterned circuit layer covering the bumps.

In an embodiment of the present invention, part of the chip is exposed by the molding compound.

In an embodiment of the present invention, the chip is entirely encapsulated by the molding compound.

As embodied and broadly described herein, the present invention is directed to provide a stacked chip package structure. The stacked chip package structure includes a plurality of stacked chip packages mentioned above, wherein the outer terminals of the chip package disposed in the upper layer are corresponding to the first openings of the chip package disposed in the lower layer, and the outer terminals of the chip package disposed in the upper layer are electrically connected to the patterned circuit layer of the chip package disposed in the lower layer.

In an embodiment of the present invention, the stacked chip package structure further comprises a common carrier, wherein the chip packages are stacked on the common carrier, and the chip packages are electrically connected to the common carrier.

Compared with the conventional technology, the chip package in the present invention does not have the core dielectric layer, thus having thinner thickness. Moreover, the stacked chip package structure formed by stacked chip packages has high package integrity because each chip package has thinner thickness.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
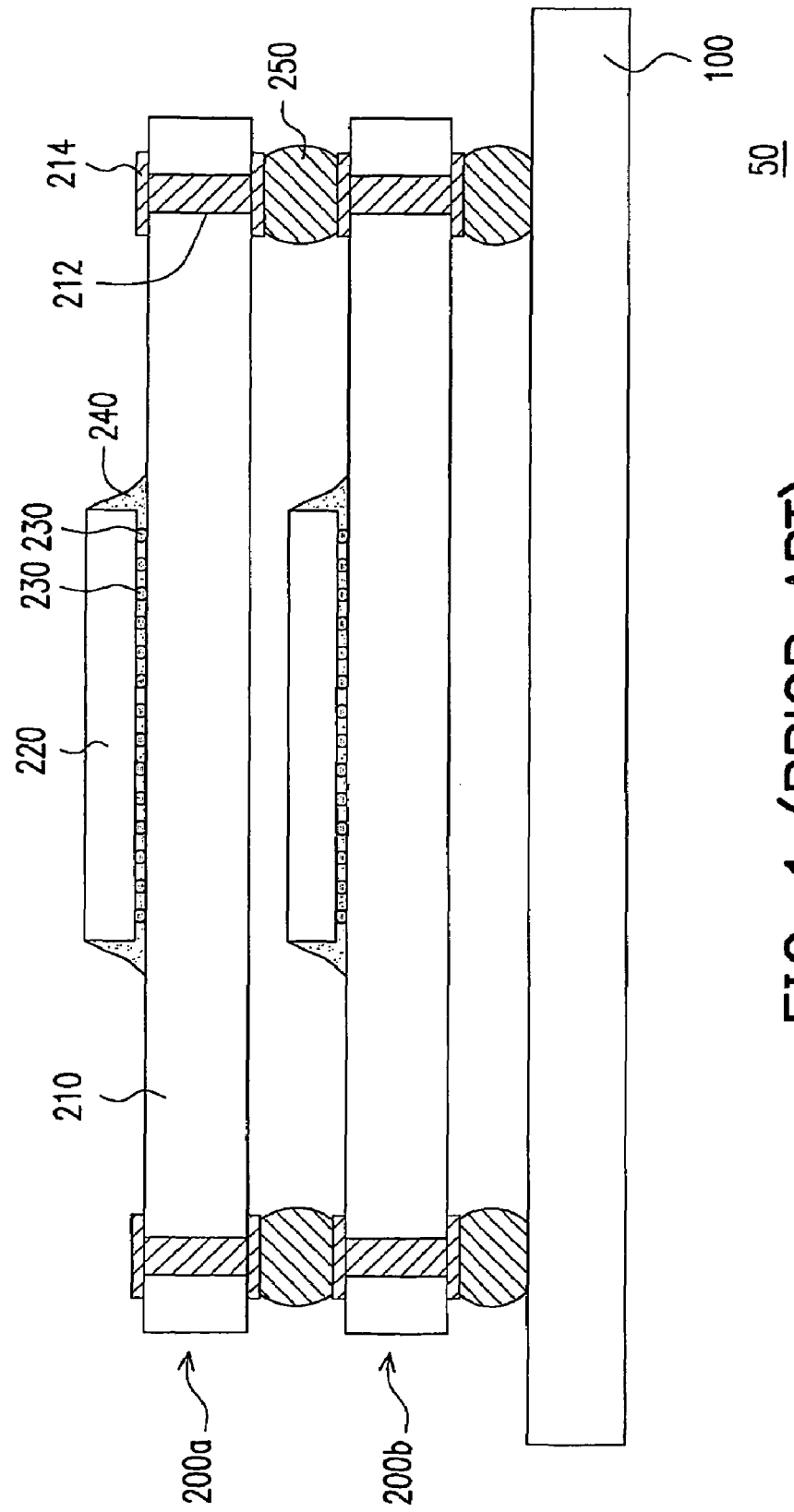
FIG. 1 is a cross-sectional diagram of a conventional stacked chip package structure.
Figure 2A:
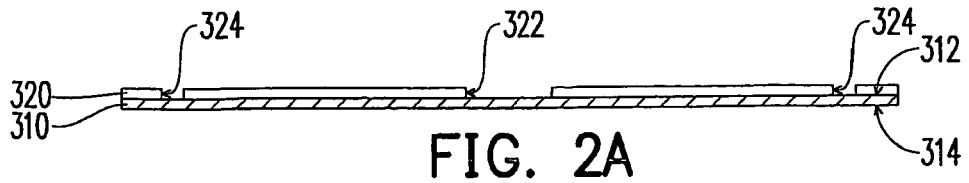
FIG. 2A to FIG. 2F are flow charts showing the manufacturing process of the chip package according to the first embodiment of the present invention.

FIG. 2A to FIG. 2F are flow charts showing the manufacturing process of the chip package according to the first embodiment of the present invention. Referring to FIG. 2A, first, a conductive layer 310 is provided, wherein the conductive layer 310 has a first surface 314 and a second surface 312 opposite to each other, and the material of the conductive layer 310 is copper. Then, a solder mask 320 is formed on the second surface 312, and the solder mask 320 is patterned in a photolithography and etching process to form a second opening 322 and multiple first openings 324, wherein part of the conductive layer 310 is exposed by the second opening 322 and the first opening 324. In one embodiment, a brown oxidation or a black oxidation process can further be performed on the conductive layer 310 to improve the surface roughness of the conductive layer 310. Accordingly, the combination between the conductive layer 310 and the solder mask 320 is improved.

Figure 2B:
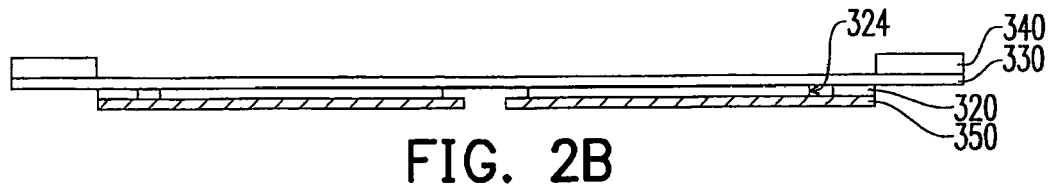

Then, referring to FIG. 2B, a diaphragm 330 is formed on the solder mask 320 to serve as the carrier for the conductive layer 310 and the solder mask 320 in the subsequent manufacturing processes, wherein the diaphragm 330, for example, can be attached on the solder mask 320 by the adhesive compound or be directly formed on the solder mask 320 in another process. Therefore, the conductive layer 310 and the solder mask layer 320 can obtain enough support in the subsequent processes to ensure a smooth operation in the subsequent processes. In one embodiment, the diaphragm 330 can also be fixed on the frame 340 to provide better support for the conductive layer 310 and the solder mask 320. Thereafter, the conductive layer 310 is patterned to form the patterned circuit layer 350 in a photolithography and etching manufacturing process.

Figure 2C:
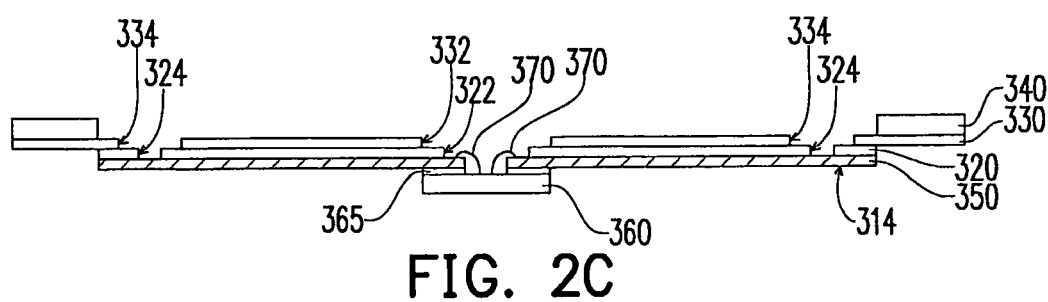

Then, referring to FIG. 2C, an opening 332 and multiple openings 334 are formed on the diaphragm 330 in a photolithography and etching manufacturing process. Then, a chip 360 is disposed on the first surface 314 by disposing the adhesive compound 365 between the chip 360 and the patterned circuit layer 350 to fix the relative positions of each other, for example. Then, in a wire bonding technology, the chip 330 is electrically connected to the patterned circuit layer 350 by multiple conductive wires 370. Wherein, the material of the conductive wires 370 is, for example, Au. Part of the patterned circuit layer 350 is exposed by the first opening 324 and the opening 334, and part of the patterned circuit layer 350 and part of the chip 330 are exposed by the second opening 322 and the opening 332.

Of course, the opening 332 and the opening 334 can be formed after or before the conductive layer 310 is patterned. Then, the conductive layer 310 is patterned to form the patterned conductive layer 350.

Figure 2D:
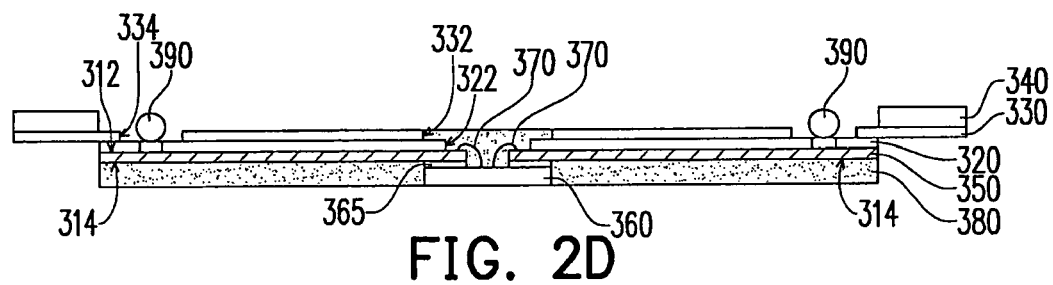

Referring to FIG. 2D, a molding compound 380 is formed on the patterned circuit layer 350 by a suitable mold to cover on the patterned circuit layer 350 and the chip 360, and also fix the chip 360 onto the patterned circuit layer 350. Moreover, the molding compound 380 can be further filled into the second opening 322 by a suitable mold to cover on the conductive wire 370. In addition, an outer terminal 390 can be formed on each first opening 324. Accordingly, the outer terminal 390 is electrically connected to the patterned circuit layer 350 by the first opening 324. For example, when the outer terminal 390 is a solder ball, the outer terminal 390 is electrically connected to the patterned circuit layer 350 by a reflowing process.

Figure 2E:
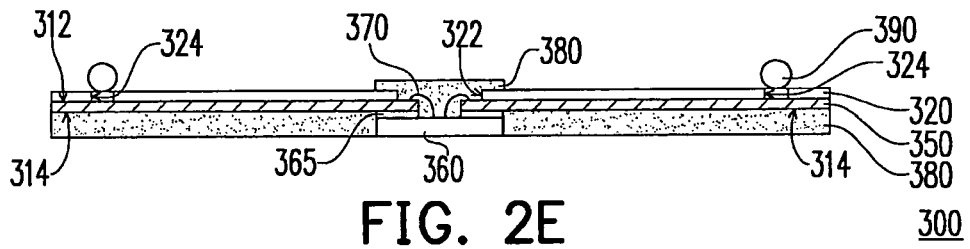
Figure 2F:
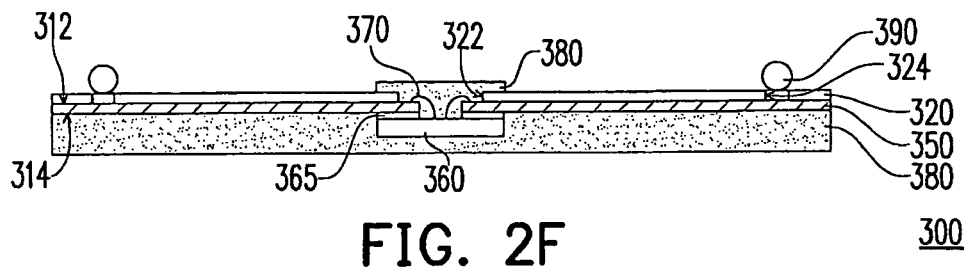

Then, referring to FIG. 2E, the diaphragm 330 is removed to obtain the chip package 300, wherein the diaphragm 330 is removed, for example, in an etching process, an ashing process, or other process. Although part of the chip 360 is exposed by the molding compound 380 in the embodiment, it is clear that the molding compound 380 can cover the chip 360 by a suitable mold, as shown in FIG. 2F.

Therefore, the chip package 300 of the present invention mainly includes a patterned circuit layer 350, a chip 360, a solder mask 320, and a molding compound 380. Wherein, the patterned circuit layer 350 has a second surface 312 and a first surface 314 opposite to each other. The chip 360 disposed on the first surface 314 is electrically connected to the patterned circuit layer 350. The solder mask 320 disposed on the second surface 312 has multiple first openings 324 by which part of the patterned circuit layer 350 is exposed. The molding compound 380 covers the pattern circuit layer 350 and fixes the chip 360 onto the patterned circuit layer 350. Compared with the conventional technology, the chip package 300 does not have the core dielectric layer, thus having thinner thickness.

The Second Embodiment

In the manufacturing process of the chip package, the chip 360 can also be electrically connected to the patterned circuit layer 350 in a flip chip technology, chip on film (COF) technology or other technology in addition to the wire bonding technology in the first embodiment. The following will illustrate the manufacturing process of the chip package in a flip chip technology as an example.

Figure 3A:
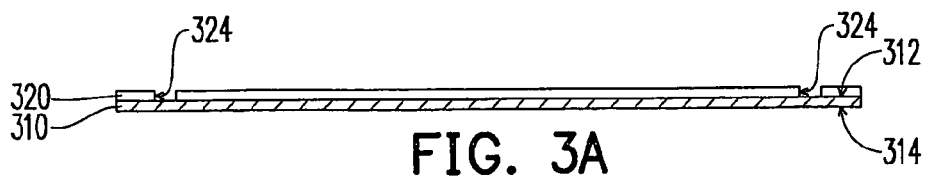
FIG. 3A to FIG. 3F are flow charts showing the manufacturing process of the chip package according to the second embodiment of the present invention.

FIG. 3A to FIG. 3E are flow charts showing the manufacturing process of the chip package according to the second embodiment of the present invention. Referring to FIG. 3A, first, a conductive layer 310 is provided, wherein the conductive layer 310 has a second surface 312 and a first surface 314 opposite to each other. Then, a solder mask 320 is formed on the second surface 312, and the solder mask 320 is patterned, for example, in a photolithography and etching process to form multiple first openings 324, wherein part of the conductive layer 310 is exposed by the first opening 324. Also, a brown oxidation or a black oxidation process can be performed on the conductive layer 310 to improve the surface roughness of the conductive layer 310. Accordingly, the bonding between the conductive layer 310 and the solder mask 320 is improved.

Figure 3B:
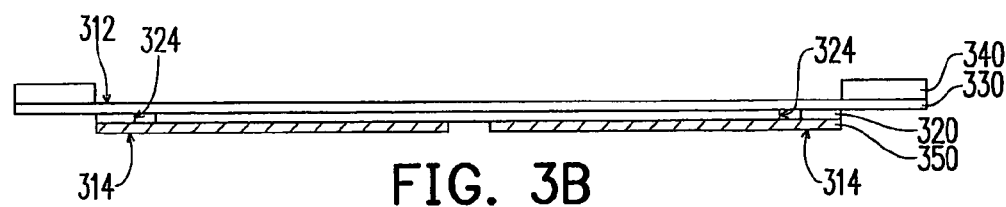

Then, referring to FIG. 3B, the diaphragm 330 is formed on the solder mask 320 to serve as the carrier for the conductive layer 310 and the solder mask 320 in the subsequent manufacturing process, wherein the diaphragm 330, for example, can be attached on the solder mask 320 by an adhesive compound or be directly formed on the solder mask 320 in another process. Also, the diaphragm 330 can also be fixed on the frame 340 to provide better support for the conductive layer 310 and the solder mask 320. Thereafter, the conductive layer 310 is patterned to form the patterned circuit layer 350 in a photolithography and etching manufacturing process.

Figure 3C:
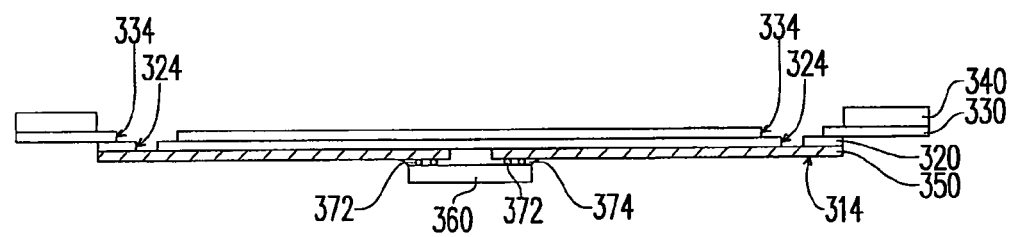

Then, referring to FIG. 3C, multiple openings 334 are formed on the diaphragm 330 in a photolithography and etching manufacturing process. Then, in a flip chip technology, the chip 360 is disposed on the first surface 314 by disposing multiple bumps 372 between the chip 360 and the patterned circuit layer 350, and a reflowing process is performed for the bumps 372. Accordingly, the chip 330 is electrically connected to the patterned circuit layer 350 by multiple bumps 372. Wherein, the material of the bumps 372 is, for example, soldering tin, Au or other conductive materials, and part of the patterned circuit layer 350 is exposed by the first opening 324 and the opening 334. Moreover, in the embodiment, an under fill 374 can be further formed between the chip 360 and the patterned conductive layer 350 to cover each bump 372.

Figure 3D:
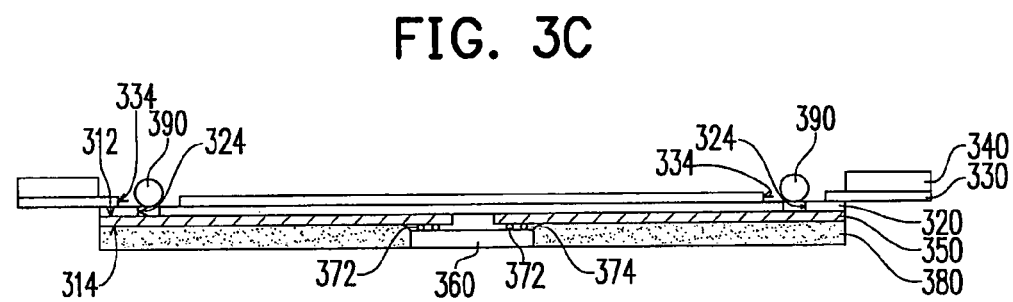

Referring to FIG. 3D, the molding compound 380 is formed on the patterned circuit layer 350 by a suitable mold to cover the patterned circuit layer 350 and the chip 360, and also fix the chip 360 onto the patterned circuit layer 350. Note that if there is no under fill 374 formed between the chip 360 and the patterned conductive layer 350 in the process in FIG. 3C, the molding compound 380 can further substitute the under fill 374 to cover the bumps 372. In addition, an outer terminal 390 can be formed on each first opening 324. Accordingly, the outer terminal 390 is electrically connected to the patterned circuit layer 350 by the first opening 324. For example, when the outer terminal 390 is a solder ball, the outer terminal 390 is electrically connected to the patterned circuit layer 350 in a reflowing process.

Figure 3E:
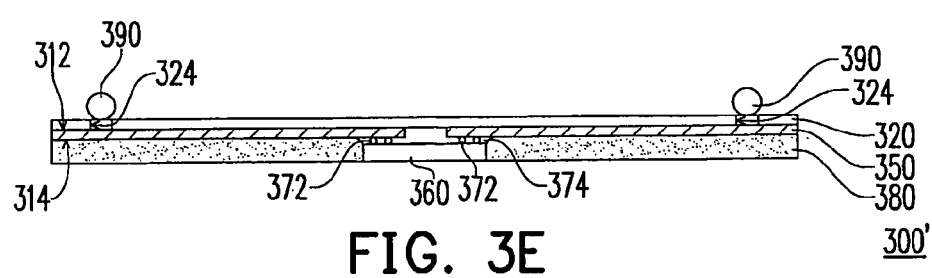
Figure 3F:
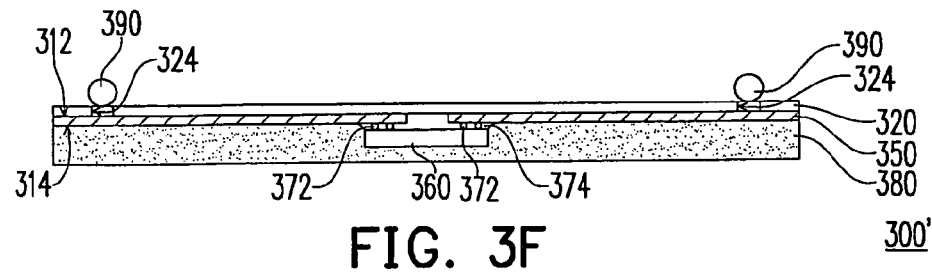

Then, referring to FIG. 3E, the diaphragm 330 is removed to obtain the chip package 300', wherein the diaphragm 330 is removed in a process described in FIG. 3E. Although part of the chip 360 is exposed by the molding compound 380 in the embodiment, it is clear that the molding compound 380 can cover the chip 360 by a suitable mold, as shown in FIG. 3F.

The Third Embodiment

In addition to the chip package 300 and 300', the manufacturing process of the chip package of the present invention can also be used to make another chip package suitable for making a stacked chip package structure, and the manufacturing process is described in detail in the following.

Figure 4A:
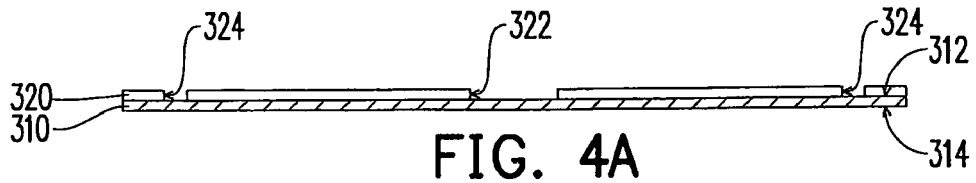
FIG. 4A to FIG. 4E are flow charts showing the manufacturing process of the chip package according to the third embodiment of the present invention.

FIG. 4A to FIG. 4E are flow charts showing the manufacturing process of the chip package according to the third embodiment of the present invention. Referring to FIG. 4A, first, a conductive layer 310 is provided, wherein the conductive layer 310 has a second surface 312 and a first surface 314 opposite to each other. Then, a solder mask 320 is formed on the second surface 312, and the solder mask 320 is patterned, for example, in a photolithography and etching process to form the second opening 322 and a plurality of first openings 324, wherein part of the conductive layer 310 is exposed by the second opening 322 and the first opening 324. In one embodiment, a brown oxidation or a black oxidation process can further be performed on the conductive layer 310 to improve the roughness of the surface of the conductive layer 310, such that the conductive layer 310 and the solder mask 320 have better bonding.

Figure 4B:
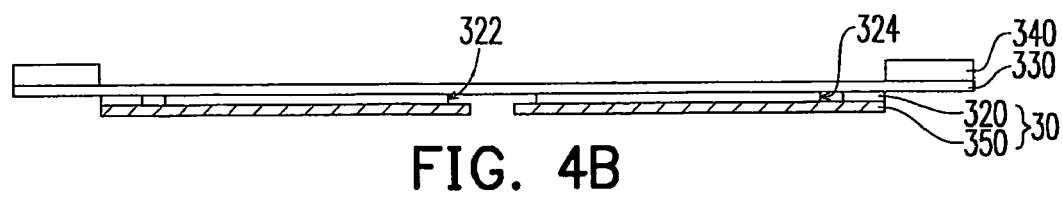

Then, referring to FIG. 4B, the diaphragm 330 is formed on the solder mask 320 to serve as the carrier for the conductive layer 310 and the solder mask 320 in the subsequent manufacturing process, wherein the diaphragm 330, for example, can be attached on the solder mask 320 by an adhesive compound or be directly formed on the solder mask 320 in other process. Accordingly, the conductive layer 310 and the solder mask layer 320 can have enough support in the subsequent process to ensure a smooth operation in the subsequent processes. Also, in one embodiment, the diaphragm 330 can also be fixed on the frame 340 to provide better support for the conductive layer 310 and the solder mask 320. Thereafter, the conductive layer 310 is patterned to form the patterned circuit layer 350 in a photolithography and etching manufacturing process.

Figure 4C:
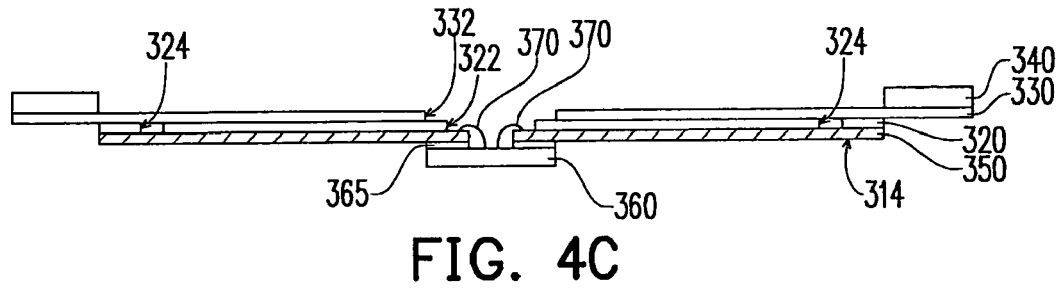

Then, referring to FIG. 4C, the chip 360 is disposed on the first surface 314 by disposing the adhesive compound 365 between the chip 360 and the patterned circuit layer 350, for example. Then, for example, in a wire bonding technology, the chip 330 is electrically connected to the patterned circuit layer 350 by multiple conductive wires 370. Wherein, part of the patterned circuit layer 350 and part of the chip 330 are exposed simultaneously by the second opening 322 and the opening 332.

Of course, the opening 332 and the opening 334 can be formed after or before the conductive layer 310 is patterned. Then, the conductive layer 310 is patterned to form the patterned conductive layer 350.

Figure 4D:
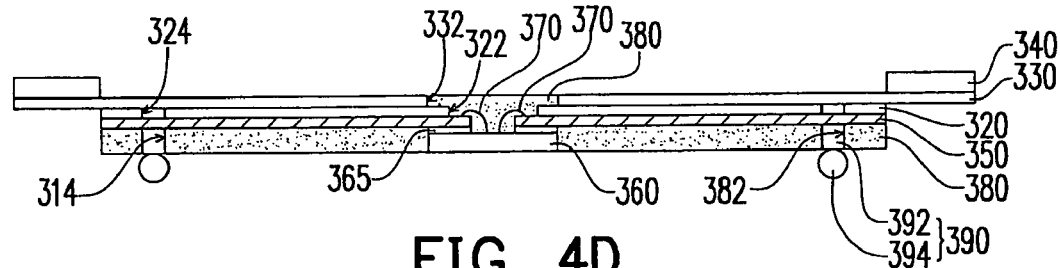

Referring to FIG. 4D, the molding compound 380 is formed on the patterned circuit layer 350 by a suitable mold to cover the patterned circuit layer 350 and the chip 360, and also fix the chip 360 onto the patterned circuit layer 350. Moreover, the molding compound 380 can further be filled into the second opening 322 by a suitable mold to cover the conductive wire 370. In addition, multiple through holes 382 are formed on the molding compound 380 by which part of the patterned circuit layer 350 is exposed. Wherein, the forming method of the through hole 382 includes, for example, forming these through holes 382 while molding the molding compound 380, or forming these through holes 382 in a mechanical drill or laser ablation process after the molding compound 380 is formed, or in other process.

Then, an outer terminal 390 is formed in each through hole 382, and the outer terminal 390 is electrically connected to the patterned circuit layer 350 by the through hole 382. In one embodiment, the outer terminal 390 includes a conductive pole 392 and a solder ball 394. The conductive pole 392 disposed within the through hole 382 is electrically connected to the patterned circuit layer 350, wherein the conductive pole 392 is formed within the through hole 382, for example, in an electroplating process; or, by filling the conductive material into the through hole 382 directly to form the conductive pole 392; or, directly disposing the conductive pole 392 on the predefined position to form the through hole 392 on the mold, and performing a molding process for the molding compound 382, and accordingly, the configuration of the conductive pole 392 is completed at the same time when the through hole 382 is formed. The solder ball 394 is disposed on the conductive pole 392 and is electrically connected to the conductive pole 392.

Figure 4E:
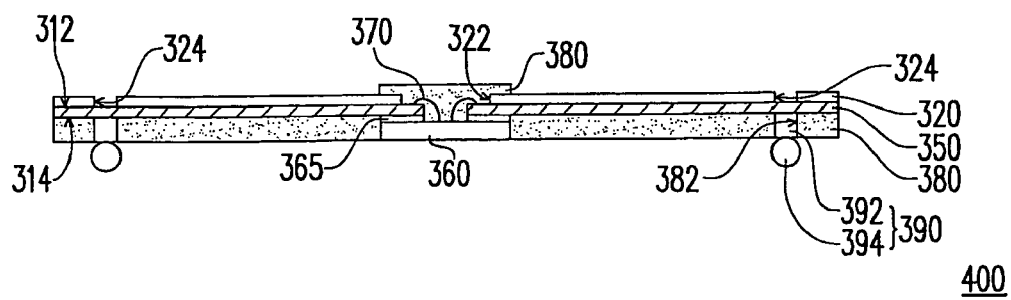

Referring to FIG. 4E, the diaphragm 330 is removed to obtain the chip package 400, and the diaphragm 330 is removed in the process described in FIG. 2E. Of course, it can be learned from the first embodiment and the second embodiment that electrical connection between the chip 360 and the patterned circuit layer 320 can also be achieved by a flip chip technology, chip on film (COF) technology or other technology, and, the detail is omitted here.

Accordingly, the chip package 400 according to the embodiment mainly includes a patterned circuit layer 350, a chip 360, a solder mask 320, a molding compound 380 and multiple outer terminals 390. Wherein, the patterned circuit layer 350 has a second surface 312 and a first surface 314 opposite to each other. The chip 360 disposed on the first surface 314 is electrically connected to the patterned circuit layer 350. The solder mask 320 disposed on the second surface 312 has multiple openings 324 by which part of the patterned circuit layer 350 is exposed. The molding compound 380 covers the pattern circuit layer 350 and fixes the chip 360 onto the patterned circuit layer 350, wherein the molding compound 380 has a plurality of through holes 382. An outer terminal 390 disposed in each through hole 382 is electrically connected to the patterned circuit layer 350.

Figure 5:
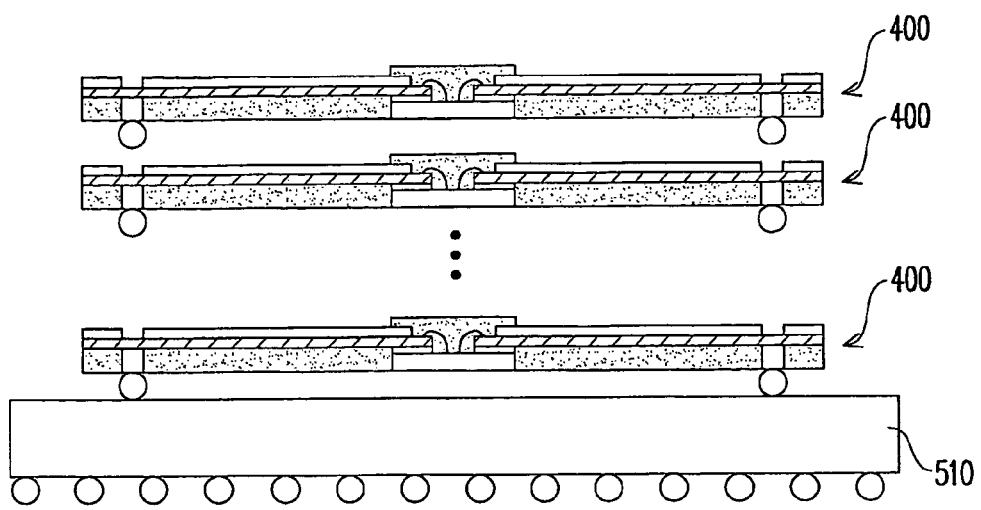
FIG. 5 is a diagram of the stacked chip package structure according to the third embodiment of the present invention.

The present invention further provides a stacked chip package structure based on the above chip package 400. FIG. 5 is a diagram of the stacked chip package structure according to the third embodiment of the present invention. The stacked chip package structure 500 mainly includes multiple chip packages 400 stacked on each other, wherein each outer terminal 390 of the chip package 400 disposed in the upper layer is corresponding to the first opening 324 of the chip package 400 disposed in the lower layer, and each outer terminal 390 of the chip package 400 disposed in the upper layer is electrically connected to the patterned circuit layer 350 of the chip package 400 disposed in the lower layer. Moreover, the stacked chip package structure 500 further includes a common carrier 510 where the chip packages 400 can be stacked, and the chip package 400 can be electrically connected to the common carrier 510 by the outer terminal 390 of the chip package 400 disposed in the lowest layer.

Compared with the conventional technology, the chip package 400 has thinner thickness. The stacked chip package structure 500 having multiple chip packages 400 not only has more thickness reduction capability, but also higher package integrity.

The Fourth Embodiment

Figure 6A:
FIG. 6A to FIG. 6D are flow charts showing the manufacturing process of the chip package according to the fourth embodiment of the present invention.

FIG. 6A to FIG. 6D and FIG. 2B to FIG. 2E are flow charts showing the manufacturing process of the chip package in sequence according to the fourth embodiment of the present invention. The embodiment discloses another manufacture process of the chip package of the present invention. Referring to FIG. 6A, first, a conductive layer 310 is provided, wherein the conductive layer 310 has a second surface 312 and a first surface 314 opposite to each other. Then, a diaphragm 600 is formed on the first surface 314.

Figure 6B:
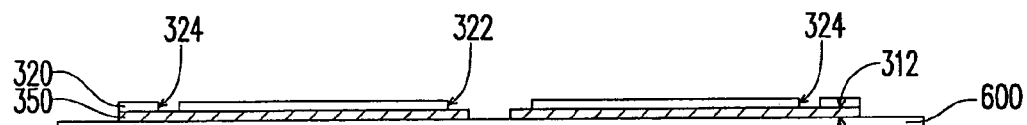

Then, referring to FIG. 6B, the conductive layer 310 is patterned to form the patterned circuit layer 350 in a photolithography and etching manufacturing process. Then, a solder mask 320 is formed on the second surface 312, and the solder mask 320 is patterned in a photolithography and etching process to form a second opening 322 and a plurality of first openings 324, wherein part of the conductive layer 310 is exposed by the second opening 322 and the first opening 324.

Figure 6C:
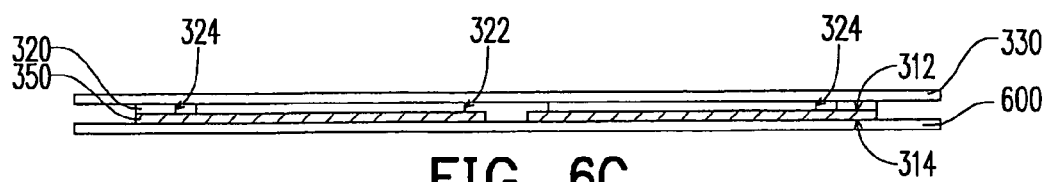
Figure 6D:
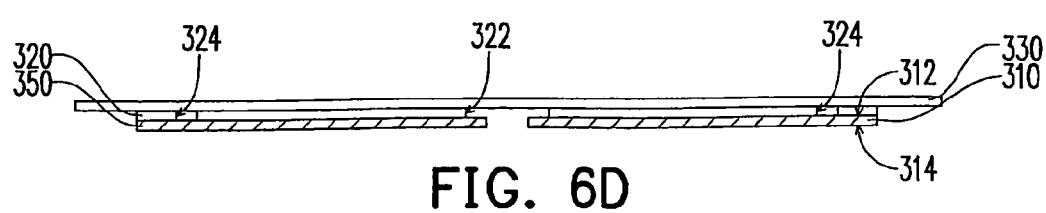

Then, referring to FIG. 6C and FIG. 6D, the diaphragm 330 is first formed on the folder mask 320 to form the structure as shown in FIG. 6C. Thereafter, as shown in FIG. 6D, the diaphragm 600 is removed to obtain the structure as shown in FIG. 2B. The subsequent processes are the same as described in FIG. 2B to FIG. 2E, so that the details are omitted here. The diaphragm 600 is removed, for example, in an etching process, a tearing off process, an ashing process or other process.

In summary, compared with the conventional technology, the chip package in the present invention does not have the core dielectric layer, thus having thinner thickness. Moreover, the stacked chip package structure with stacked chip packages has thinner thickness and higher package integrity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
   a base, consisting of:
      a patterned circuit layer having a first surface and a second surface opposite to each other; and
      a solder mask disposed on the second surface, wherein the solder mask has a plurality of first openings by which part of the patterned circuit layer is exposed;
   a chip disposed on the first surface, wherein the chip is electrically connected to the patterned circuit layer;
   a molding compound covering the pattern circuit layer and fixing the chip onto the patterned circuit layer;
   a plurality of outer terminals disposed in the first openings, wherein the outer terminals are electrically connected to the patterned circuit layer, the solder mask and the outer terminals cover the second surface of the patterned circuit layer entirely; and
   a plurality of bumps disposed between the chip and the patterned circuit layer, wherein the chip is electrically connected to the patterned circuit layer through the bumps.

2. The chip package as claimed in claim 1, wherein the outer terminals include solder balls.

3. The chip package as claimed in claim 1, further comprising an under fill disposed between the chip and the patterned circuit layer covering the bumps.

4. The chip package as claimed in claim 1, wherein a part of the chip is exposed by the molding compound.

5. The chip package as claimed in claim 3, wherein the molding compound and the under fill cover the first surface of the patterned circuit layer entirely.

* * * * *